United States Patent [19]

Stagaman

[11] Patent Number: 5,563,684
[45] Date of Patent: Oct. 8, 1996

[54] ADAPTIVE WAFER MODULATOR FOR PLACING A SELECTED PATTERN ON A SEMICONDUCTOR WAFER

[75] Inventor: Gregory J. Stagaman, Dallas, Tex.

[73] Assignee: SGS-THOMSON Microelectronics, Inc., Carrollton, Tex.

[21] Appl. No.: 346,854

[22] Filed: Nov. 30, 1994

[51] Int. Cl.$^6$ .............................. G03B 27/58; G03B 27/42
[52] U.S. Cl. .................. 355/72; 355/53; 355/55; 355/47
[58] Field of Search .................. 355/52, 53, 76, 355/46, 72, 47

[56] References Cited

U.S. PATENT DOCUMENTS

| | | | |
|---|---|---|---|
| 4,093,378 | 6/1978 | Horr et al. | 355/76 |
| 4,298,273 | 11/1981 | Nishizuka et al. | 355/61 |
| 4,425,038 | 1/1984 | La Fiandra et al. | 355/73 |
| 4,666,291 | 5/1987 | Taniguchi et al. | 355/52 |
| 5,331,369 | 7/1994 | Terasawa et al. | 355/53 |
| 5,359,389 | 10/1994 | Isohata | 355/53 |
| 5,448,332 | 9/1995 | Sakakibara et al. | 355/53 |

*Primary Examiner*—Arthur T. Grimley
*Assistant Examiner*—Herbert V. Kerner
*Attorney, Agent, or Firm*—David V. Carlson; Theodore E. Galanthay; Lisa K. Jorgenson

[57] ABSTRACT

An adaptive wafer modulator in a photolithography device is described. A focal pattern of a lithographic system is calibrated. Prior to exposing a wafer surface to a selected image pattern, the wafer surface is elastically bent or modulated by actuating a set of adjustable pins supporting the wafer so that the wafer surface being exposed conforms more closely to the calibrated focal pattern of the lithographic system than to the presumed flat focal plane of the lithographic system.

23 Claims, 5 Drawing Sheets

ADAPTIVE WAFER MODULATOR FOR PLACING A SELECTED PATTERN ON A SEMICONDUCTOR WAFER

TECHNICAL FIELD

This invention relates to a lithography device and more specifically to an adaptive wafer modulator for modulating the exposure area of a wafer surface so that the exposure area conforms more closely to the focal pattern of a selected imaging system in the lithography device.

BACKGROUND OF THE INVENTION

Photolithography is a well-known technique for fabricating integrated circuits by placing a selected pattern on a wafer surface. An image plate having a desired pattern is prepared and placed on a light path created by a light source. The illuminated pattern then passes through an imaging system, typically a lens or a combination of a lens and mirror, for focusing the pattern on a wafer. The wafer is placed on a chuck which securely retains the wafer by creating a vacuum under the wafer. The desired pattern on the image plate is then transferred to a portion of the wafer surface by light passing through the lens and exposing that portion of the wafer surface. In one current system, the entire pattern of the image plate is transferred in one exposure. In another current system, a slit is positioned between the image plate and the wafer. While the wafer and the image plate laterally moves in concert, a strip of the desired pattern passing through the slit exposes the wafer surface until the entire portion of the exposure area is exposed. After the exposure, a stage moves the chuck to a different portion of the wafer surface. The process of exposing the wafer surface is then repeated until all portions of the wafer are exposed. A typical wafer contains one to several hundred chips with each chip having an identical pattern.

As circuit density of integrated circuits has increased over the years, photolithography devices have become increasingly sophisticated. The focus and leveling mechanism has improved a great deal to accommodate the finer resolution present day integrated circuits require. For more precise focus of an image pattern being illuminated on the wafer surface, a modern photolithography device uses a multi-point sensor alignment system to position the wafer under the imaging system and to compensate for the uneven thickness of the wafer. The system first assumes that the focused image of a selected pattern lies flat on a plane and the focal point of every spot on the selected pattern being placed on the wafer surface falls on that plane. Then, the wafer is raised toward or lowered from the imaging system to align the presumed focal plane of the imaging system to the wafer surface. In a current process called field to field leveling, the wafer may also be tilted so that the wafer surface being illuminated is parallel to the presumed flat focal plane of the imaging system.

The assumption of a flat focal plane of the imaging system has been sufficient over the past years. However, as the minimum circuit dimension approaches sub-micron level, that assumption becomes problematic. All lenses have curvature defects and many currently available commercial lenses and focusing systems have a flatness guarantee of about 0.5 micron or, for the best lenses, 0.3 micron. This means that a focal point on the actual focal pattern can deviate from the presumed flat focal plane by as much as 0.5 micron. Further, the 0.5 micron deviation can increase significantly if one or more mirrors are used to reflect light from the light source. In fabricating sub-micron circuits, even a deviation of a fraction of one micron can have a significant effect on accurate transfer of an image pattern leading to poorly defined circuit elements and ultimately lower chip yield.

SUMMARY OF THE INVENTION

According to principles of the present invention, an adaptive wafer modulator is provided for elastically deforming the exposure area of the wafer so that the exposure area conforms more closely to the true focal pattern of an imaging system.

An actual focal pattern of a selected imaging system is pre-calibrated. An image plate with a calibration pattern is placed on a light path created by a light source. The illuminated pattern then passes through an imaging system and illuminates a plurality of photo-sensitive calibration surfaces with each surface being illuminated at a slightly different distance from the other surfaces. From the processed calibration surfaces, a focal pattern for the imaging system is calibrated.

Unlike the prior art system that uses a set of fixed height pins to support a wafer, the present invention utilizes a set of adjustable height pins to support the wafer. Wafer modulation is achieved by varying the height of one or more adjustable pins to elastically bend a portion of the wafer surface being illuminated so that the surface conforms more closely to the actual focal pattern of the selected imaging system rather than to a flat plane. This method of compensating for curvature defects of an imaging system allows a mask image to be transferred on the wafer surface with more accuracy and definition. It also allows less expensive lenses to be used in a photolithography system because of the surface modulating capability. Ultimately, the current invention allows fabrication of finer circuit elements and higher chip yield.

DETAILED DESCRIPTION OF THE INVENTION

Figure 1:
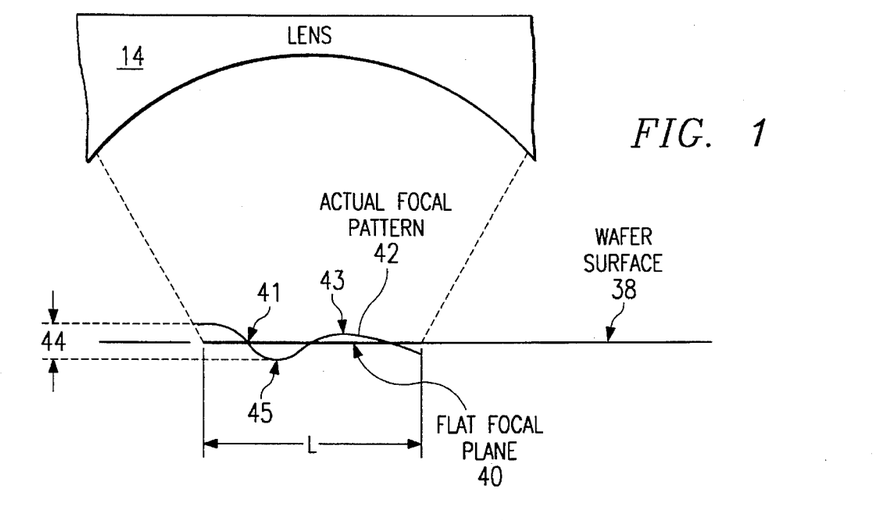
FIG. 1 is a side view of a photolithography device showing the presumed focal plane and the actual focal pattern of a selected lens.

FIG. 1 illustrates a problem of the prior art photolithography devices. A focal plane 40 of a selected lens 14, shown in two dimension only, is assumed in the prior an devices to lie on a flat plane. The focal pattern 42 has a length L as a lateral dimension and a width W (see FIG. 4). The length L and the width W have a finite distance, significantly greater than a point, and usually at least the size of one entire die. In current systems, for example, the length L of a die may be in the range of 5 to 50 mm and the width W in the range of 5 to 35 mm. This may, however, change with each particular die and imaging system being used. Thus, a focal pattern for a typical die would be approximately 20 mm by 5 mm for some embodiments. Of course, semiconductor dies have many different sizes and shapes and may be shorter or longer or wider or narrower, and this example is given merely to illustrate that the focal pattern has a definite length and width as it impinges on the surface of a wafer. Some focal patterns image two or more dies simultaneously or just a part of one die, and thus can be larger or smaller than a single die.

The entire length and width of the focal pattern has been assumed to lie on a single flat focal plane 40, for the entire pattern. According to the prior art, the wafer surface 38 is positioned to be the correct focal distance and held uniformly flat with respect to the lens 14 to achieve the clearest, sharpest exposure possible on the wafer surface. Applicant has recognized that the lens 14 and the illumination system may not always create the ideal flat pattern. Small variations in the optical qualities of the lens 14 or in the focusing system may create a focal pattern 42 which does not lay on a flat focal plane 40. Thus, for a single exposure, a part of the focal pattern may be in actual focus exactly on the wafer surface 38, as shown at 41, another part of the focal pattern may be somewhat too distant from the lens, as shown at 45, or alternatively, may be too close to the lens, as shown at 43. The difference between the near focus point 43 and the farthest focus point 45 within a single focal pattern 42 is the depth of the deviation 44 of the actual focal pattern 42 from the flat focal plane 40.

Previously, this focus deviation 44 was sufficiently small that it was not of significant concern in achieving a high quality exposure of the focal pattern on the wafer surface 38. With a high-quality full lithographic system and a good optical lens 14, the deviation 44 over a selected distance could be sufficiently small that the focal pattern 42 could be presumed as flat. However, the reduced feature size of the smallest dimension in a focal pattern makes an accurate focus on the wafer surface 38 more critical than was previously necessary.

In the prior art, a great deal of effort was taken to ensure that the upper portion of the wafer surface 38 was an exact distance from the lens 14 to ensure wafer surface was at the focal plane for the lens 14. This included, according to various prior art devices, measurements at one, three, five or more different points immediately adjacent the lens, to ensure that the wafer surface was completely planar with respect to the lens and was a selected distance from the lens during exposure to the pattern. The measurements may, for example, be taken at each of the four sides of the lens. Using the measurements, the wafer surface was positioned by the stage to ensure that it was completely flat with respect to the lens and at the proper distance from the lens. This approach is acceptable if the focal plane is at a uniform distance from the lens 14.

A problem that has been recognized by the applicant is that for a particular lens system, the focal point across the entire lens may not lie on a flat plane. In most commercially available lenses, the deviation 44 of a focal point from any position of the presumed flat focal plane 40 can be as much as 0.5 micron from the actual focal pattern 42. Hence, a simple field to field leveling method which assumes a flat focal plane 40 for the focal pattern 42 is inadequate to reliably place sub-micron circuit patterns in proper focus on the wafer surface 38.

According to the present invention, a system of pre-calibrating the actual focal pattern 42 of the imaging system 14, then bending the wafer surface 38 being exposed to the focal pattern to conform more closely to the actual focal pattern ensures a more accurate focus of the image on the wafer.

Figure 2:
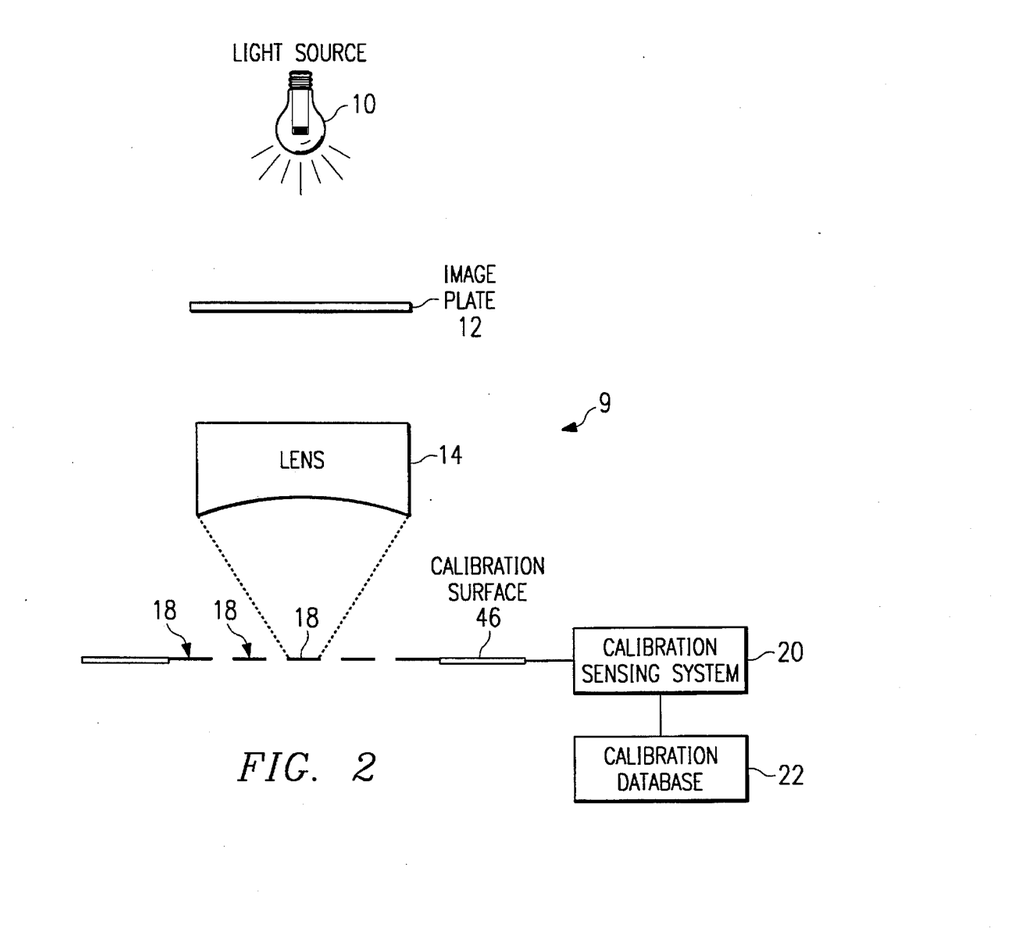
FIG. 2 is a side view of a photolithography device set up for calibration of a selected lens according to the invention.

FIG. 2 shows a lithographic system 9 being calibrated. The system 9 includes an image plate 12 with a calibration pattern thereon (not shown) and placed between a light source 10 and the lens 14. The light from the light source 10 illuminates the calibration pattern on a calibration surface 46. The term light as used herein is intended to include the full spectrum of light waves including ultra violet rays and X-rays. The calibration surface 46 is operated in conjunction with the calibration sensing system 20 to determine the exact focal pattern 42 of a given photolithographic system. After the calibration is completed, the details of the shape of the focal pattern 42 are stored in a calibration database 22.

Any number of suitable calibration systems 20 are acceptable for use to perform the calibration of the photolithographic system 9. For example, an active feedback system may be used which senses the focus at various points across the length and the width of the focal pattern and bends the calibration surface using an adaptive optical modulator of a type described later herein to determine when a good focus has been achieved across the entire length and width of the focal pattern. When this is achieved, the deviations from the presumed flat focal plane are determined and stored in the calibration database for later use in the adaptive optical modulator of the present invention as described herein. In another alternative calibration method currently practiced in the art, the calibration surface 46 is repeatedly exposed to a selected image pattern from the lens 14 at a number of different positions 18. The patterns 18 are each exposed at a slightly different distance from the lens. After several dozen, or possibly several hundred, exposures at slightly different distances of a focal pattern on a portion 18 of the calibration surface, the exposed image of each is manually examined under a microscope to determine which portion of the image is in focus and the distance of the calibration surface from the lens is compared for each such exposure. Each of the calibration measurements are compared to determine which portions of the focal pattern are in focus at each selected distance from the lens 14. Any differences from the flat focal plane are determined by this analysis and stored in the calibration database 22. Many techniques are available in the prior art to determine whether a particular focal pattern is in sharp focus. A simple, yet sufficient example of such is the type of focal test pattern such as that used on photocopy machines today, which includes many fine detailed items, a close grouping of horizontal lines and a close grouping of vertical lines. If these detailed patterns and close grouping of lines are faithfully reproduced, with no blurring from the image plate to the exposed calibration surface 46, this is an indication that a clear focus has been achieved. There are, of course, other techniques for determining that a clear focus exists at the calibration surface 46 as will be apparent to those of skill in the art.

While FIG. 1 shows a step and repeat method to expose a plurality of portions 18 of one calibration surface 46, an alternative embodiment using a plurality of photo-sensitive calibration surfaces can be used. The calibration surfaces are then processed to produce calibration images. A calibration sensing system 20 compares the calibration images to each other, measures the focal point deviation of every portion of the calibration pattern, the combination of the focal points defining an actual focal pattern of the selected lens, and stores the focal pattern in the calibration database 22. One data structure format for storage of a focal pattern may be a three dimensional matrix with variables X and Y representing a coordinate position of a chip surface within the wafer and variable Z representing a focal point deviation for the coordinate position of that chip surface. In the embodiment shown, a calibration database 22 stores focal patterns of a plurality of image plate shapes since the surface area being illuminated on the wafer is different for each image plate shape.

In another embodiment, however, only one focal pattern that covers the entire area of the selected lens needs to be stored. Once that focal pattern in the photolithographic system 9 is calibrated, the pattern alignment electronics of the present invention will be used to dynamically calculate the focal pattern of a selected image plate 12. The deviation from flat for the entire surface capable of being illuminated by the largest usable plate is measured and stored in database 22.

Generally, each photolithographic system 9 must be specifically calibrated to determine the true focal pattern and any deviation 44 from the flat focal plane 40. Generally, this is performed in situ, after the photolithographic system has been set up at the manufacturing location ready for use. It may also be done at the factory, prior to shipment of the photolithographic system to the customer. As may be appreciated, the main cause for deviations from the flat focal plane will generally be in the lens 14 and mirrors because they does not create a perfectly flat focal plane at the focus distance. However, there may be other reasons for the deviation, including position and type of the light source, relative position of the image plate 12 and the equipment which stabilizes the photolithographic system 9 as a whole. As will be appreciated, once the photolithographic system 9 has been calibrated, it will generally be maintained in the same relationship so that recalibration is not necessary. Thus, a single lifetime calibration at the start of the use of the equipment will likely be acceptable for the lifetime use of the photolithographic system 9. Alternatively, periodic recalibration of the system may be desired to ensure that throughout the lifetime use of the equipment the focal pattern 42 has the desired focus as it impinges upon the wafer surface 38.

Figure 3:
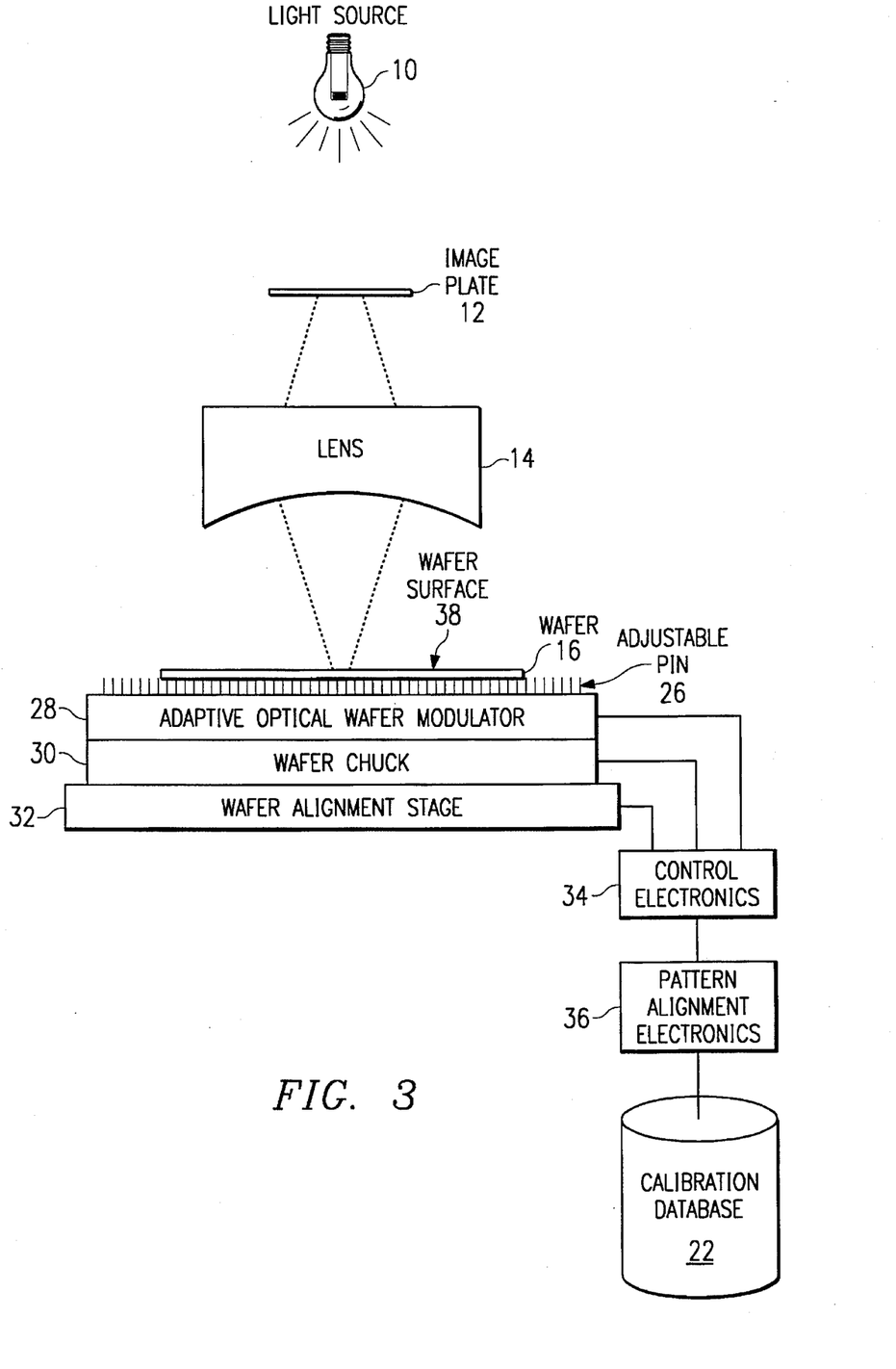
FIG. 3 is a side view of a photolithography device with an adaptive wafer modulator of the present invention.

FIG. 3 shows a preferred embodiment of the present invention to faithfully transfer an image pattern to a wafer surface 38. The system includes an adaptive optical wafer modulator 28, a wafer chuck 30, and a wafer alignment stage 32. Control electronics 34, pattern alignment electronics 36 and the calibration database 22 are also part of the system. An image plate 12 having a desired pattern is placed between a light source 10 and a selected lens 14. This is usually known in the industry as a reticle. It contains a photo pattern for exposure to the wafer surface 38 for creating a mark or other pattern useful in the formation of a final semiconductor die. A wafer 16 is placed on a plurality of individually height adjustable pins 26. The wafer 16 is securely retained on the pins 26 by any technique of the prior art, such as by a vacuum chuck as is well known, per se. Once securely retained, the wafer alignment stage 32, again, of any currently known type in the art, is used for stepping wafer 16 and field to field leveling in which the exposure area of the wafer surface 38 being patterned is tilted and aligned with the presumed flat focal plane of the image. After the wafer is properly aligned and positioned for exposure to a presumed flat focal plane, the wafer surface 38 is then bent, by elastic deformation, to a non-flat surface that conforms to the true focal pattern for that particular optical system. A pattern alignment electronics 36 accesses a calibration database 22 to obtain the proper customized focal pattern for the photolithographic system 9. The control electronics 34 coupled to the pattern alignment electronics 36 is connected to the stage 32 for regulating stepping and field to field leveling. The control electronics 34 is also connected to the adaptive optical wafer modulator 28 for regulating the modulator 28. In an alternative embodiment, the wafer modulator 28 rather than the stage 32 achieves the field to field leveling and tilting motion by actuating the appropriate adjustable pins 26. Prior to exposure of the chip surface within the wafer 16, the wafer modulator 28 actuates the adjustable pins 26 by extending selected pins and retracting other pins to temporarily bend (or modulate) that portion of the wafer surface being illuminated.

Figure 4:
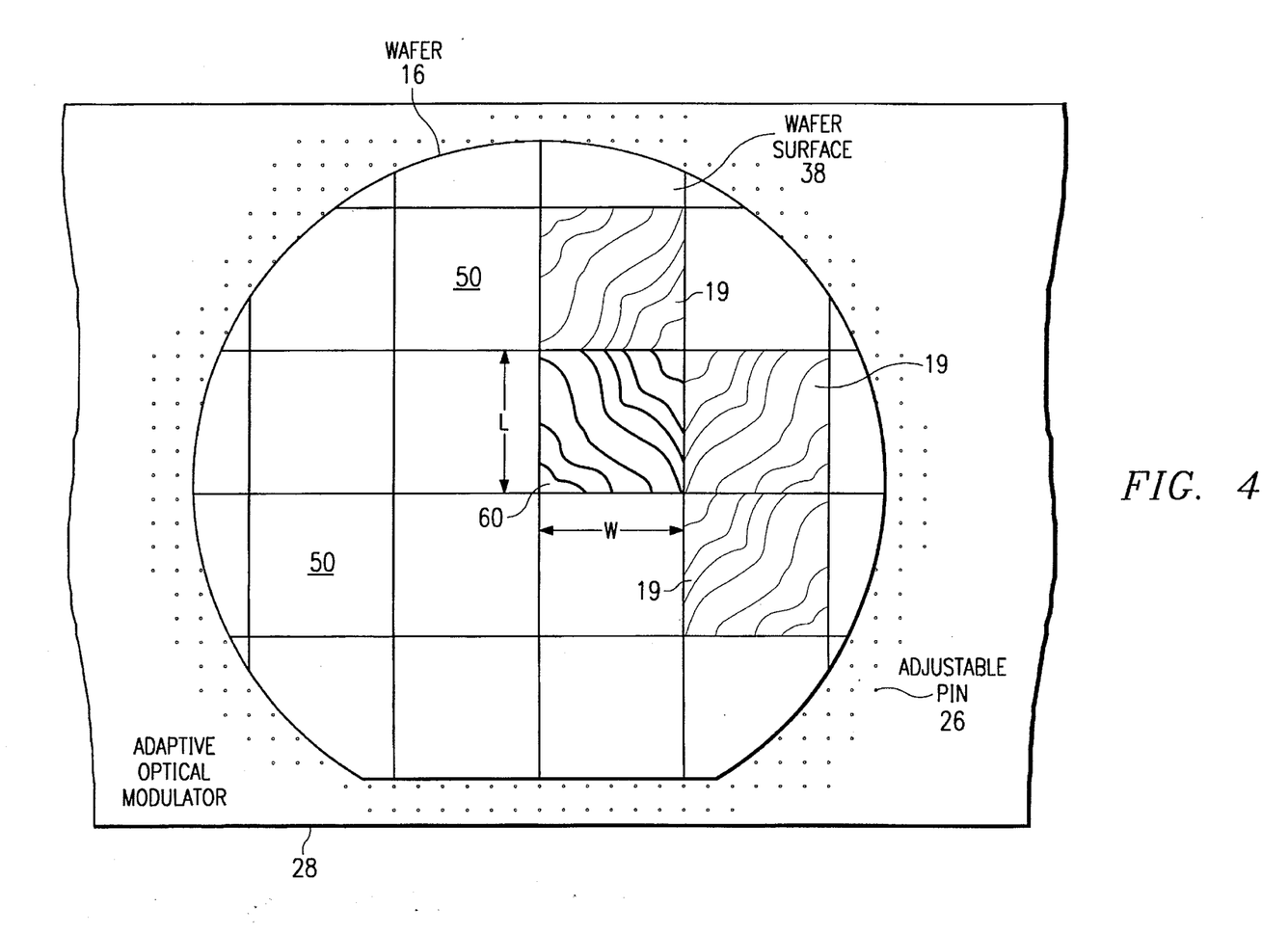
FIG. 4 is a top view of a wafer supported by adjustable pins from the underside of the wafer and shows several exposed chip surfaces and one chip surface being exposed to a selected pattern.

Referring now to FIG. 4, the chip surface 60 is about to be exposed to an image pattern by a wafer stepper device and is in a modulated position. The adjustable pins 26 under the selected portion cause the wafer surface 60 are actuated to substantially match the focal pattern of the photolithographic system 9 to the portion 60 surface. FIG. 4 further shows the individual exposed pattern locations 19 and unexposed pattern locations 50 on the wafer. While each pattern is being exposed, a plurality of pins 26 support the wafer and the vacuum chuck, securely holding the wafer in contact with each pin 26, regardless of its height. Only that portion 60 being exposed is deformed; the rest of the wafer remains at its natural (usually flat) shape. The actuated pins under the chip surface 60 are more clearly seen in FIG. 5 which shows an enlarged lateral view of the chip surface 60 as it is being exposed.

Figure 5:
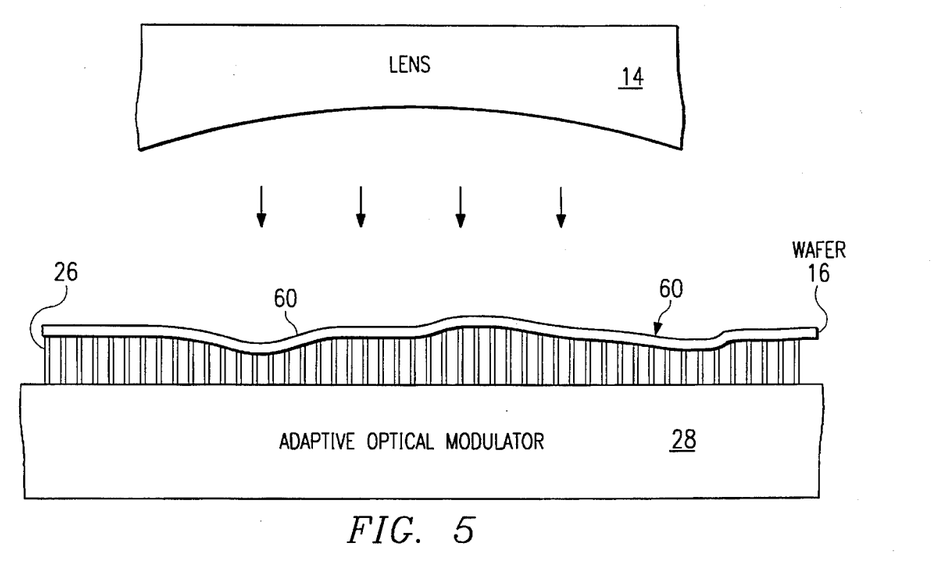
FIG. 5 is an enlarged cross-sectional view of the chip surface being exposed.

As shown in FIG. 5, each individual pin 26 may be extended or retracted a selected length by the adaptive optical modulator. The vacuum chuck 30 holds the wafer 16 in tight contact with each individual pin 26. Thus, as a single pin 26 is retracted, the wafer surface 16 will deflect slightly downward at that isolated location. Similarly, as one or more pins 26 are extended, the wafer surface will bend upward and be closer to the lens 14 at that particular location. The pattern of pins 26 which retract and extend is selected according to the calibration pattern that is stored in the calibration database 22. Thus, for each imaging system in which the calibration pattern indicates that some portion of the wafer surface should be closer to the lens 14 and some portions should be further from the lens 14 to create a perfect focus across the entire top surface 60 of the wafer 16, the adaptive optical modulator is activated by the control electronics 34 to elastically bend the surface 60 upward or downward, respectively, into proper alignment for exact focus at all points which may be exposed to the pattern from the lens 14.

The adaptive optical modulator 28 may be of a type which is currently used in the telescope and astronomical observation art. Adaptive optical modulators are, by themselves, well known. In high-quality telescopes, adaptive optical modulators are presently used to slightly bend one or more focusing mirrors within the telescope to create an ideally focused pattern after the light from the distant stars has passed through a number of lenses. An adaptive optical modulator 28 of the type used for mirrors in telescopes and the control electronics capable of controlling movement of individual pins 26 by amounts of one micron or fractions thereof is suitable for use in the present invention once it is calibrated in the photolithographic system as used for exposing wafers during semiconductor processing.

Figure 6:
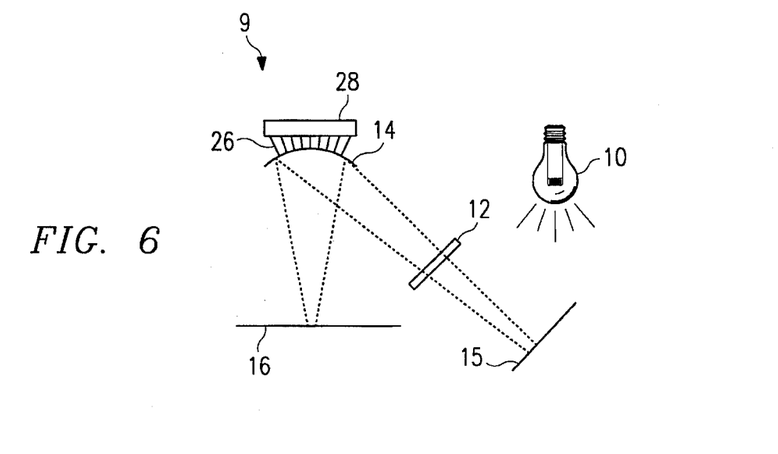
FIG. 6 is a side view of an alternative photolithography device that includes a mirror and an adaptive wafer modulator on top of a lens.

FIG. 6 illustrates an alternative imaging system 9 using one or more mirrors. Rather than using a single lens 14, the imaging system 9 may include one or more mirrors 15 that reflect the light before, or after, it passes through the image plate 12. The lens 14 shown in FIG. 6 is a mirror lens. Thus, it reflects light in a selected shape rather than being a through light lens of the type shown in FIGS. 2 and 3. Thus, the term lens as used herein includes both through light lenses and reflective lenses. Further, the adaptive optical modular 28 may be placed either behind the reflective lens 14 or on the wafer, one of these alternatives being shown in FIG. 6, but it could be behind the wafer 16 in this system also. The modulator 28 may also be placed behind a mirror 15. This permits the light to be properly focused to a flat focal plane by the same calibration techniques previously described herein by bending a mirror and leaving the wafer flat if desired.

The invention may also be used with a scanning imaging system. As will be appreciated, many imaging systems today expose only a portion of the wafer at a time; however, some scanning systems slowly scan the entire wafer, to expose the whole wafer in a single pass. According to the present invention, if used in a scanning system, either a mirror or the entire wafer is deflected by the adaptive optical modulator to ensure that the entire portion being exposed, even if it is the entire wafer, is in the proper, exact focus.

Figure 7:
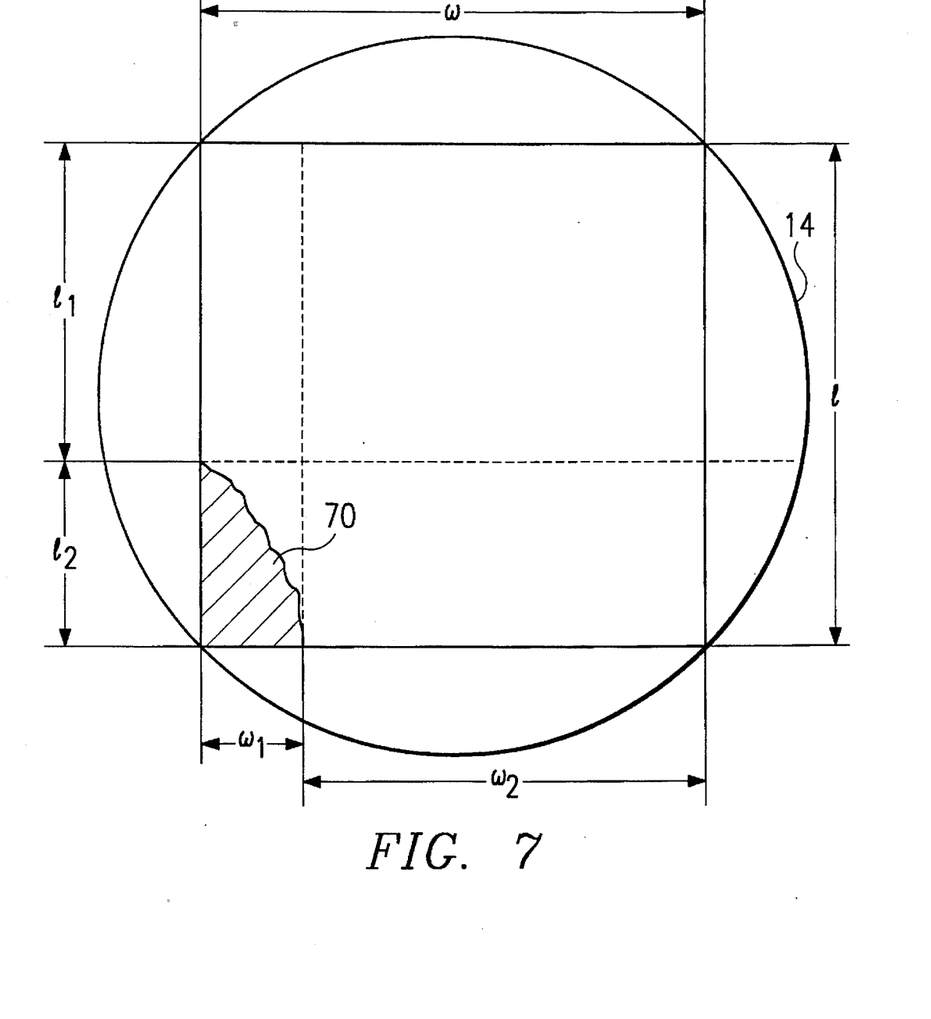
FIG. 7 is a top view of a lens showing a portion of the lens with curvature defects.

FIG. 7 is a top view of a lens showing a portion of the lens 70 defined by $l_2$ and $w_1$ with focusing defects. For most lithographic systems, the area of the lens that produces the most flat focal pattern will generally correspond to the center portion of the lens, with most of the non-flat areas of the focal pattern coming from the perimeter of the lens. For this reason, most image plates in the prior art systems are aligned with the center of the lens as shown in FIG. 3. It will be appreciated, however, that each image plate has a different size focal pattern. As the plate size gets larger, it will use a larger portion of the lens. In the prior art systems, any image plate whose selected pattern passes through the defect area 70 of the lens 14 could not be used. Thus, only the lens areas defined by $l_1$ and w, or 1 and $w_2$ could have been used. According to principles of the present invention, however, the entire area of the lens can be used, thereby accommodating larger images to be patterned on a wafer surface. A user first calibrates the focal pattern of the lithographic system 9. The system 9 then uses the adaptive optical modulator 28 to modulate the wafer corresponding to that portion of the exposure area that passes through the curvature defect area 70 so that the entire area being imaged generally conforms to the calibrated focal pattern of the lithographic system.

This illustrates one of the many advantages of the present invention. Only that portion of the wafer that needs to be modulated is deformed and all other portions remain unchanged.

An apparatus and method for modulating the wafer surface have been disclosed herein. While various embodiments have been described in this application for illustrative purposes, the claims are not limited to the embodiments described herein. Equivalent devices or steps may be substituted for those described, which operate according to the principles of the present invention, and thus fall within the scope of the claims.

I claim:

1. A lithography system for placing a selected pattern on a wafer comprising:

a light source;

a wafer positioned such that light from the light source impinges on a portion thereof;

an image plate positioned between the light source and the wafer, the image plate having a selected pattern thereon;

a lens positioned between the image plate and the wafer for focusing the selected pattern on the wafer surface; and a chuck supporting the wafer, the chuck including a wafer modulator operable to elastically bend the portion of the wafer surface on which the light is impinging so that the elastically bent portion generally conforms more closely to a calibrated focal pattern of an imaging system than to a presumed flat focal plane of the imaging system.

2. The lithography system according to claim 1 wherein the wafer modulator further comprises a plurality of adjustable pins mounted onto the chuck, the adjustable pins for supporting the wafer and elastically bending the wafer surface;

a means for securely retaining the wafer in contact with the adjustable pins; and a means for varying the height of selected individual pins to bend the portion of the wafer surface supported by the selected pins.

3. The lithography system according to claim 1 further comprising control electronics connected to the chuck for controlling the wafer modulator; and a pattern alignment electronics connected to the control electronics, the pattern alignment electronics for outputting through the control electronics data representing the calibrated focal pattern of the imaging systems to the wafer modulator.

4. The lithography system of claim 1 further including at least one mirror positioned in the light.

5. The lithography system according to claim 1 wherein the wafer wafer modulator is operable to elastically bend a different portion of the wafer surface for light from the light source to impinge thereon such that the different portion generally conforms more closely to the calibrated focal pattern of the imaging system than to the presumed flat focal plane of the imaging system.

6. A lithography system for placing a selected pattern on a wafer comprising:

a light source;

a wafer positioned for light from the light source to impinge thereon;

an image plate means positioned between the light source and the wafer for creating a selected pattern on the wafer;

a focusing means positioned between the image plate and the wafer for focusing the selected pattern on a selected portion of the wafer surface; and a chuck means for retaining the wafer, the chuck including a wafer modulator means for elastically deforming the selected portion to a non-flat surface so that the elastically deformed portion conforms more closely to a calibrated focal pattern of an imaging system than to a presumed flat focal plane of the imaging system, while the selected portion is exposed to the selected pattern.

7. The lithography system according to claim 6 wherein the wafer modulator further comprises a plurality of adjustable pins mounted onto the chuck, the adjustable pins for supporting the wafer and elastically deforming the wafer surface; and a means for securely retaining the wafer on the adjustable pins.

8. The lithography system according to claim 6 further comprising control electronics connected to the chuck for controlling the wafer modulator; and a pattern alignment electronics connected to the control electronics, the pattern alignment electronics for outputting through the control electronics data representing the calibrated focal pattern of the imaging system to the wafer modulator.

9. The lithography system of claim 6 wherein the focusing means includes a mirror in the light path between the light source and the wafer for directing the light onto the wafer.

10. The lithography system of claim 6 wherein the focusing means includes a lens through which the light passes for directing the light onto the selected portion of the wafer.

11. The lithography system according to claim 5 wherein after the selected portion is exposed to the selected pattern, the wafer modulator means is operable to elastically deform a different portion other than the selected portion of the wafer surface for light from the light source to impinge thereon such that the different portion generally conforms more closely to the calibrated focal pattern of the imaging system than to the presumed flat focal plane of the imaging system.

12. A lithography system for placing a selected pattern on a wafer comprising:

a light source;

a lens;

an image plate holder adapted to position an image plate between the light source and the lens; and a chuck for retaining a wafer in a position such that light from the light source impinges thereon, the chuck including a wafer modulator adapted to bend that portion of the wafer on which the light impinges to a non-flat surface so that the bent portion of the wafer generally conforms more closely to a calibrated focal pattern of an imaging system than to a presumed flat focal plane of the imaging system.

13. The lithography system according to claim 12 wherein the wafer modulator is operable to bend a different portion of the wafer for light from the light source to impinge thereon such that the different portion generally conforms more closely to the calibrated focal pattern of an imaging system than to the presumed flat focal plane of the imaging system.

14. A method in a lithography system for aligning the surface of a semiconductor wafer with a focal pattern of an imaging system comprising the steps of:

placing an image plate having a desired pattern between a light source and a selected lens;

positioning a wafer for light from the light source impinging thereon;

bending a portion of the wafer on which the light passing through the image plate impinges to a non-flat surface of the wafer that conforms more closely to a calibrated focal pattern of the imaging system than to a presumed flat focal plane of the imaging system.

15. The method according to claim 14 further including, prior to the placing of an image plate having a desired pattern, the steps of:

placing an image plate having a calibration pattern between the light source and the selected lens;

illuminating through the selected lens a plurality of calibration surfaces to expose each calibration surface to the calibration pattern of the image plate, each calibration surface being illuminated at a slightly different distance from the selected lens; and calibrating the focal pattern of the imaging system by sensing the locations of a plurality of focal points across the calibration surfaces.

16. The method according to claim 14 further including, prior to the placing of an image plate having a desired pattern, the steps of:

placing an image plate having a calibration pattern between the light source and the selected lens;

illuminating through the selected lens a calibration surface with the calibration pattern of the image plate; and using an active feedback system to calibrate the focal pattern of the imaging system by modulating the calibration surface to sense the locations of a plurality of focal points across the calibration surface.

17. The method according to claim 14, further comprising the step of exposing the portion of the wafer on which the light impinges to the desired pattern of the image plate; and for each portion of the wafer other than the exposed portion, repeating the following steps:

positioning the each portion for light from the light source to impinge thereon;

bending the each portion to a non-flat surface such that the each portion conforms more closely to the calibrated focal pattern of the imaging system than to the presumed flat focal plane of the imaging system; and exposing the each portion of the wafer on which the light impinges to the desired pattern of the image plate.

18. The method according to claim 17 wherein the step of positioning the each portion includes the step of adjusting a mirror of the imaging system for light from the light source to impinge on the each portion.

19. A method in a lithography system for aligning the surface of a semiconductor wafer with a calibrated focal pattern of an imaging system comprising the steps of:

placing an image plate having a desired pattern between a light source and a selected lens;

positioning a wafer to receive light from the light source;

elastically deforming a portion of the wafer surface so that the elastically deformed portion generally conforms more closely to a calibrated focal pattern of the imaging system than to a presumed flat focal plane of the imaging system; and illuminating the elastically deformed portion of the wafer surface to expose the desired pattern thereon.

20. The method according to claim 19 further including, prior to the placing of an image plate having a desired pattern, the steps of:

placing an image plate having a calibration pattern between the light source and the selected lens;

illuminating through the selected lens a plurality of calibration surfaces to expose each calibration surface to the calibration pattern of the image plate, each calibration surface being illuminated at a slightly different distance from the selected lens; and calibrating a focal pattern of the imaging system by sensing the locations of a plurality of focal points across the calibration surfaces.

21. The method according to claim 19 further including, prior to the placing of an image plate having a desired pattern, the steps of:

placing an image plate having a calibration pattern between the light source and the selected lens;

illuminating through the selected lens a calibration surface with the calibration pattern of the image plate; and using an active feedback system to calibrate a focal pattern of the imaging system by modulating the calibration surface to sense the locations of a plurality of focal points across the calibration surface.

22. The method according to claim 19, further comprising the step of for each portion of the wafer surface other than the illuminated portion, repeating the following steps:

positioning the each portion for light from the light source to impinge thereon;

elastically deforming the each portion to a non-flat surface such that the each portion conforms more closely to the calibrated focal pattern of the imaging system than to the presumed flat focal plane of the imaging system; and exposing the each portion to the desired pattern of the image plate.

23. The method according to claim 22 wherein the step of positioning the each portion includes the step of adjusting a mirror of the imaging system for light from the light source to impinge on the each portion.

* * * * *